United States Patent
Park

(10) Patent No.: US 9,643,386 B2
(45) Date of Patent: May 9, 2017

(54) LOW EMISSIVITY FILM AND WINDOW HAVING THE SAME

(71) Applicant: ELECTRONICS AND TELECOMMUNICATIONS RESEARCH INSTITUTE, Daejeon (KR)

(72) Inventor: Rae-Man Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/008,414

(22) Filed: Jan. 27, 2016

(65) Prior Publication Data

US 2016/0263865 A1 Sep. 15, 2016

(30) Foreign Application Priority Data

Mar. 9, 2015 (KR) .................. 10-2015-0032534
Dec. 17, 2015 (KR) .................. 10-2015-0181120

(51) Int. Cl.
*B32B 17/10* (2006.01)
*H05K 1/02* (2006.01)
*B32B 7/12* (2006.01)

(52) U.S. Cl.
CPC .......... *B32B 17/10018* (2013.01); *B32B 7/12* (2013.01); *B32B 17/10376* (2013.01);
(Continued)

(58) Field of Classification Search
CPC ................ B32B 17/10018; B32B 7/12; B32B 17/10376; H05K 1/0274
(Continued)

(56) References Cited

U.S. PATENT DOCUMENTS 6,562,471 B1 * 5/2003 Martin .................... C22C 21/00
148/437
2007/0036989 A1 * 2/2007 Medwick ................ C03C 17/36
428/432
(Continued)

FOREIGN PATENT DOCUMENTS

KR 10-2006-0077827 A 7/2006
KR 10-2013-0142369 A 12/2013

OTHER PUBLICATIONS

E.Ando et al., "Moisture resistance of the low-emissivity coatings with a layer structure of Al-doped ZnO/Ag/Al-doped ZnO", Thin Solid Films, vol. 392, pp. 289-293, Jul. 30, 2001.

*Primary Examiner* — Timothy Thompson
*Assistant Examiner* — Charles Pizzuto
(74) *Attorney, Agent, or Firm* — Rabin & Berdo, P.C.

(57) ABSTRACT

Provided are a low emissivity film and a window having the same. According to an embodiment of the inventive concept, the low emissivity film may include a first substrate, a first metal oxide layer, a first reflective layer, a second metal oxide layer, and a second substrate. The first metal oxide layer may reflect light having a wavelength of infrared rays. The light having a first wavelength is reflected by cavity effect of the first metal oxide layer, the first reflective layer, and the second metal oxide layer, and the light having a second wavelength may pass through the low emissivity film. Thus, the low emissivity film may express a color.

6 Claims, 7 Drawing Sheets

(52) U.S. Cl.
CPC ........ *H05K 1/0274* (2013.01); *B32B 2250/03* (2013.01); *B32B 2307/416* (2013.01)

(58) Field of Classification Search
USPC .......................... 174/258; 428/702, 213, 426
See application file for complete search history.

(56) References Cited

U.S. PATENT DOCUMENTS

| | | |
|---|---|---|
| 2007/0037060 A1 | 2/2007 | Lee et al. |
| 2014/0238479 A1 | 8/2014 | Lim et al. |
| 2014/0287254 A1* | 9/2014 | Hassan ............... C03C 17/2453 428/471 |
| 2015/0158763 A1 | 6/2015 | Jun |
| 2016/0047958 A1* | 2/2016 | Fujisawa ................ G02B 5/208 359/360 |

* cited by examiner

LOW EMISSIVITY FILM AND WINDOW HAVING THE SAME

CROSS-REFERENCE TO RELATED APPLICATIONS

This U.S. non-provisional patent application claims priority under 35 U.S.C. §119 of Korean Patent Application Nos. 10-2015-0032534, filed on Mar. 9, 2015, and 10-2015-0181120, filed on Dec. 17, 2015, the entire contents of which are hereby incorporated by reference.

BACKGROUND

Present disclosure herein relates to a low emissivity film, and more particularly, to a reflective layer and a metal oxide layer of a low emissivity film.

As environmental problems such as global warming have become a worldwide issue in recent years, interests in developing environment-friendly and low carbon energy and saving energy have increased. As environmental problems such as global warming have been world widely issued in the 2000s, interests in eco-friendly, low carbon, and high efficiency green energy have also increased. Government-led energy saving campaign has expanded to companies, civic organizations, and individuals. Since the typical window has a low thermal insulation property, an additional cooling/heating mechanism is necessary to maintain an indoor temperature. A low emissivity film may be a film including a reflective layer. The reflective layer includes metal having a high reflectance in an infrared region. Energy saving efforts have been conducted by attaching the low emissivity film to the window.

Furthermore, since aesthetic interest and cultural level have increased, improvement in a quality of the window is being increasingly demanded.

SUMMARY

The present disclosure provides a low emissivity film having a thermal dissipation function and a window.

The present disclosure also provides a low emissivity film expressing a color and a window.

The object of the present invention is not limited to the aforesaid, but other objects not described herein will be clearly understood by those skilled in the art from descriptions below.

An embodiment of the inventive concept provides a low emissivity film and a window having the same.

In an embodiment, the low emissivity film according to an embodiment of the inventive concept may include: a first substrate; a first metal oxide layer disposed on the first substrate, the first metal oxide layer including a first metal, in which the first metal contains at least about 90 atomic percent (at %) of one of aluminum (Al), beryllium (Be), magnesium (Mg), and lithium (Li); a first reflective layer disposed on the first metal oxide layer to reflect infrared rays; a second metal oxide layer disposed on the first reflective layer, the second metal oxide layer including a second metal, in which the second metal contains at least about 90 at % of one of aluminum (Al), beryllium (Be), magnesium (Mg), and lithium (Li); and a second substrate disposed on the second metal oxide layer, in which each of the first metal oxide layer and the second metal oxide layer has a reflective index of about 1.7 or less with respect to light having a first wavelength and light having a second wavelength. The first wavelength is one selected from about 380 nm to about 780 nm, and the second wavelength is one selected from about 380 nm to about 780 nm, which is different from the first wavelength.

In an embodiment, the first reflective layer contains silver (Ag) or aluminum (Al).

In an embodiment, the first metal oxide layer has a thickness of about 20 nm to about 50 nm, the first reflective layer has a thickness of about 10 nm to about 20 nm, and the second metal oxide layer has a thickness of about 20 nm to about 50 nm.

In an embodiment of the inventive concept, a window includes: a glass layer; an adhesion film disposed on the glass layer; a first substrate disposed on the adhesion film; a first metal oxide layer disposed on the first substrate, the first metal oxide layer including a first metal, in which the first metal contains at least about 90 atomic percent (at %) of one of aluminum (Al), beryllium (Be), magnesium (Mg), and lithium (Li); a first reflective layer disposed on the first metal oxide layer to reflect infrared rays; a second metal oxide layer disposed on the first reflective layer, the second metal oxide layer including a second metal, in which the second metal contains at least about 90 at % of one of aluminum (Al), beryllium (Be), magnesium (Mg), and lithium (Li); and a second substrate disposed on the second metal oxide layer. Each of the first metal oxide layer and the second metal oxide layer has a reflective index of about 1.7 or less with respect to light having a first wavelength and light having a second wavelength, the first wavelength is one selected from about 380 nm to about 780 nm, and the second wavelength is one selected from about 380 nm to about 780 nm, which is different from the first wavelength.

In an embodiment, the window further includes: a wiring pattern disposed on the second metal oxide layer; and a terminal connected to the wiring pattern on the second metal oxide layer.

In an embodiment, the window further includes: a second reflective layer disposed on the second metal oxide layer to reflect the infrared rays; and a third metal oxide layer disposed on the first reflective layer, the third metal oxide layer comprising a third metal. The third metal contains at least about 90 at % of one of aluminum (Al), beryllium (Be), magnesium (Mg), and lithium (Li).

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
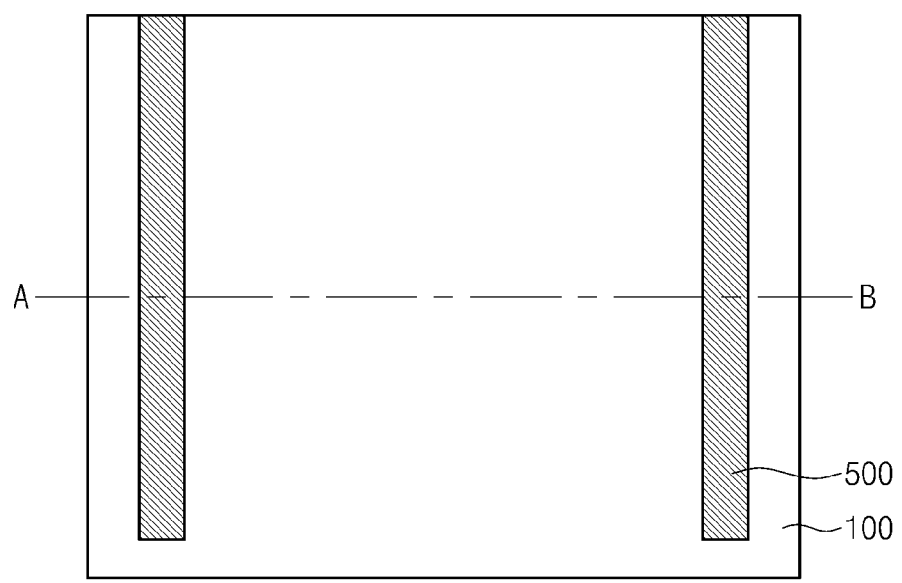
FIG. 1 is a plan view of a low emissivity film according to embodiments.

Exemplary embodiments of the present invention will be described with reference to the accompanying drawings so as to sufficiently understand constitutions and effects of the present invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. A person with ordinary skill in the technical field of the present invention pertains will be understood that the present invention can be carried out under any appropriate environments.

In the following description, the technical terms are used only for explaining a specific exemplary embodiment while not limiting the present disclosure. The terms of a singular form may include plural forms unless referred to the contrary. The meaning of 'comprises' and/or 'comprising' specifies a component, a step, an operation and/or an element does not exclude other components, steps, operations and/or elements.

In the specification, it will be understood that when a layer (or film) is referred to as being 'on' another layer or substrate, it can be directly on the other layer or substrate, or intervening layers may also be present.

Also, though terms like a first, a second, and a third are used to describe various regions and layers (or films) in various embodiments of the present invention, the regions and the layers are not limited to these terms. These terms are used only to discriminate one region or layer (or film) from another region or layer (or film). Therefore, a layer referred to as a first layer in one embodiment can be referred to as a second layer in another embodiment. An embodiment described and exemplified herein includes a complementary embodiment thereof. Like reference numerals refer to like elements throughout.

Unless terms used in embodiments of the present invention are differently defined, the terms may be construed as meanings that are commonly known to a person skilled in the art.

Hereinafter, a low emissivity film according to embodiments of the inventive concept will be described.

Figure 2:
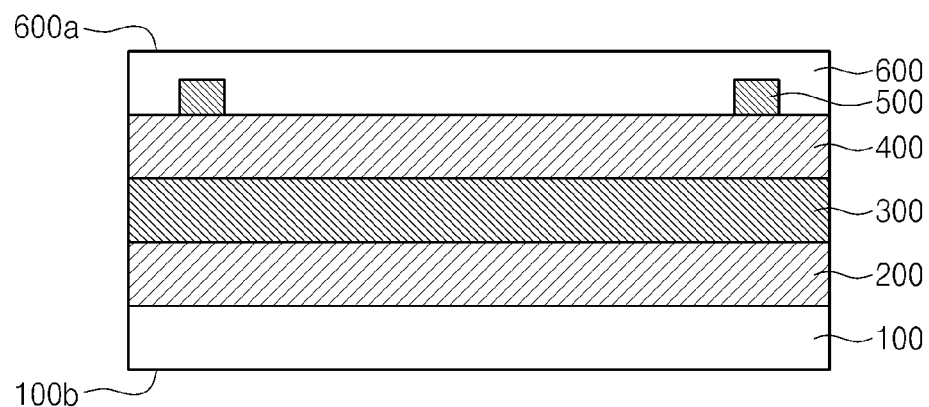
FIG. 2 is a cross-section taken along line A-B of FIG. 1.

FIG. 1 is a plan view of the low emissivity film according to embodiments. FIG. 2 is a cross-section taken along line A-B of FIG. 1.

Referring to FIGS. 1 and 2, a low emissivity film 10 may include a first substrate 100, a first metal oxide layer 200, a first reflective layer 300, a second metal oxide layer 400, and a second substrate 600. The first substrate 100 may include plastic and be flexible. The first substrate 100 may be transparent. It may be difficult that external moisture passes through the first substrate 100.

The first oxide layer 200 may be disposed on the first substrate 100. The first metal oxide layer 200 may be an amorphous metal oxide. The first oxide layer 200 may be a metal oxide containing a first metal. For example, the first metal oxide may contain about 1 atomic percent (at %) to about 40 at % of the first metal and about 60 at % to about 99 at % of oxygen. The first metal may contain about 90 at % or more of one of aluminum (Al), beryllium (Be), magnesium (Mg), and lithium (Li). The first metal may further include at least one of zinc (Zn), titanium (Ti), and tin (Sn). For example, the first metal may be doped with zinc (Zn), titanium (Ti), and tin (Sn).

The first metal oxide layer 200 may be transparent. Since the first metal contains at least about 90 at % of aluminum (Al), beryllium (Be), magnesium (Mg), and lithium (Li), the first metal oxide layer 200 may have a low refractive index, e.g., a refractive index of about 1.7 or less with respect to light λ1 having a first wavelength and light λ2 having a second wavelength. The first wavelength that is a wavelength in a visible light region may be one selected from a range of about 380 nm to about 780 nm. The second wavelength may be one selected from the range of about 380 nm to about 780 nm and different from the first wavelength. A color corresponding to the first wavelength may be different from that corresponding to the second wavelength. The first metal oxide layer 200 may have a thickness of about 20 nm to about 50 nm.

The first reflective layer 300 may be disposed on the first metal oxide layer 200. The first reflective layer 300 may contain silver (Ag) or aluminum (Al). The light λ1 having the first wavelength and the light λ2 having the second wavelength may pass through the first reflective layer 300. The first reflective layer 300 may reflect light λ3 having a third wavelength. The third wavelength that is a wavelength in an infrared region may have a range of about 780 nm to about 3 μm, preferably, a range of from about 1600 nm to about 3 μm. Hereinafter, the reflection of the light λ3 having the third wavelength or infrared rays may represent that a transmittance with respect to the third wavelength or the infrared rays is about 10% or less. The first reflective layer 300 may have a thickness of about 10 nm to about 20 nm. When the first reflective layer 300 has a thickness less than about 10 nm, it may be difficult to reflect the light λ3 having the third wavelength by the first reflective layer 300. When the first reflective layer 300 has a thickness greater than about 20 nm, the light λ1 having the first wavelength and the light λ2 having the second wavelength as well as the light λ3 having the third wavelength may be reflected by the first reflective layer 300. In this case, the low emissivity film 10 may be opaque. The first reflective layer 300 may have relatively low resistance, e.g., surface resistance less than 10 ohm/sq. When a voltage is applied to the first reflective layer 300, the first reflective layer 300 may generate heat. The first reflective layer 300 may be satisfactorily attached to the first substrate 100 by the first metal oxide layer 200. The first metal oxide layer 200 may buffer physical/mechanical force applied to the first reflective layer 300.

The second metal oxide layer 400 may be disposed on the first reflective layer 300. The second metal oxide layer 400 may be formed of a material equal or similar to that of the first metal oxide layer 200. For example, the second metal oxide layer 400 may be a metal oxide containing a second metal. The second metal oxide may contain about 1 at % to about 40 at % of the first metal and about 60 at % to about 99 at % of oxygen. The second metal may contain at least about 90 at % of one of aluminum (Al), beryllium (Be), magnesium (Mg), and lithium (Li). The second metal may further include at least one of zinc (Zn), titanium (Ti), and tin (Sn). The second metal oxide layer 400 may have a reflective index of about 1.7 or less with respect to the light λ1 having the first wavelength and the light λ2 having the second wavelength. The second metal oxide layer 400 may be transparent. The second metal oxide layer 400 may have a thickness of about 20 nm to about 50 nm. The second oxide layer 400 may buffer the physical/mechanical force applied to the first reflective layer 300.

According to embodiments, the light λ3 having the third wavelength in the infrared region may be incident into a bottom surface 100b of the first substrate 100. The first reflective layer 300 may reflect the light λ3 having the third wavelength so that the low emissivity film 10 has a heat dissipation function. The light λ1 and λ2 respectively having the first and second wavelengths in the visible light region may be incident into a top surface 600a of the second substrate 600. Each of the first metal oxide layer 200 and the second metal oxide layer 400 may have a reflective index of about 1.7 or less with respect to the light λ1 having the first wavelength. A portion of the light λ1 having the first wavelength may be reflected by cavity effect of the first metal oxide layer 200, the first reflective layer 300, and the second metal oxide layer 400. Cavity effect means that a light confined in a cavity reflects multiple times producing standing waves for a certain wavelength, and the cavity includes two facing mirrors having high reflective. Here, the first metal oxide layer 200 and the second metal oxide layer 400 may function as mirrors of cavity. The low emissivity film 10 may express a color corresponding to the first wavelength on the top surface 600a of the second substrate 600. The other portion of the light λ1 having the first wavelength may pass through the first substrate 100, the first metal oxide layer 200, the first reflective layer 300, the second metal oxide layer 400, and the second substrate 600. The light λ2 having the second wavelength may pass through the first metal oxide layer 200, the first reflective layer 300, and the second metal oxide layer 400. An object disposed on the top surface 600a of the second substrate 600 may be viewed through the bottom surface 100b of the first substrate 100. However, the object disposed on the top surface 600a of the second substrate 600 may be less clear when viewed through the bottom surface 100b of the first substrate 100 than from an upper side of the top surface 600a of the second substrate 600. Similarly, the object disposed on the top surface 600a of the second substrate 600 may be viewed through the bottom surface 100b of the first substrate 100.

When the first metal contains about 90 at % or less of at least one of aluminum (Al), beryllium (Be), magnesium (Mg), and lithium (Li), the first metal oxide layer 200 may have a refractive index greater than about 1.7 with respect to light λ1 and λ2 respectively having the first and second wavelengths. In this case, the light λ1 and λ2 respectively having the first and second wavelengths, e.g., the light having the wavelength of about 380 nm to about 780 nm may pass through the interface between the first metal oxide layer 200 and the first reflective layer 300. Likewise, when the second metal contains about 90 at % or less of at least one of aluminum (Al), beryllium (Be), magnesium (Mg), and lithium (Li), the light λ1 and λ2 respectively having the first and second wavelengths may pass through the first reflective layer 300 and the second metal oxide layer 400. When the first metal oxide layer 200 and/or the second metal oxide layer 400 has a thickness greater than about 50 nm, it may be difficult that the low emissivity film 10 expresses the color corresponding to the first wavelength on the top surface 600a of the second substrate 600. When the first metal oxide layer 200 has a thickness less than about 20 nm, the light λ1 and λ2 respectively having the first and second wavelengths may pass through the first reflective layer 300 and the second metal oxide layer 400. In this case, the low emissivity film 10 may be transparent and may not express a color. When the first metal oxide layer 200 has a thickness greater than about 50 nm, it may be difficult that the light λ1 having the first wavelength passes through the first metal oxide layer 200 and the first reflective layer 300. According to embodiments, each of the first metal oxide layer 200 and the second metal oxide layer 400 may have a thickness of about 20 nm to about 50 nm. According to embodiments, the kind and content of the first metal and the second metal and the thicknesses of the first and second metal oxide layers 200 and 400 may be adjusted to control the range and transmittance of each of the first and second wavelengths. Accordingly, the low emissivity film 10 may express a color on the bottom surface 100b of the first substrate 100 or the top surface 600a of the second substrate 600.

A wiring pattern 500 may be disposed on a top surface of the second metal oxide layer 400. As illustrated in FIG. 1, the wiring pattern 500 may cross the top surface of the second metal oxide layer 400 and extend in a first direction. An embodiment of the inventive concept is not limited to the planar shape, number, and arrangement of the wiring pattern 500. For example, the wiring pattern 500 may have a grid shape in view of a plane. For another example, the wiring pattern 500 may be disposed between the first substrate 100 and the first metal oxide layer 200.

The second substrate 600 may be disposed on the second metal oxide layer 400 and cover the wiring pattern 500. The second substrate 600 may be transparent. The second substrate 600 may include a polymer. It may be difficult that external moisture passes through the second substrate 600.

Figure 3:
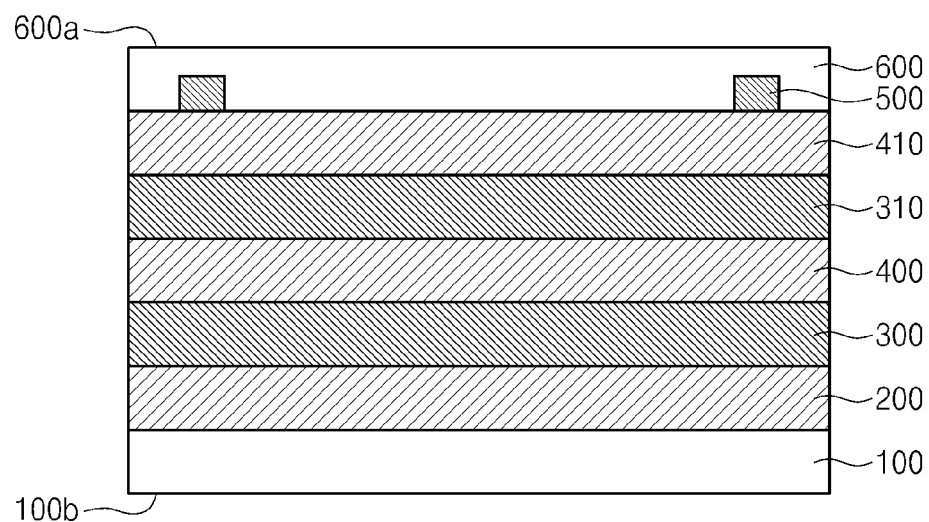
FIG. 3 is a cross-sectional view of a low emissivity film according to other embodiments.

FIG. 3 is a cross-section of the low emissivity film according to embodiments, which corresponds to the cross-section taken along line A-B in FIG. 1.

Referring to FIG. 3 together with FIG. 1, a low emissivity film 11 may include a first substrate 100, a first metal oxide layer 200, a first reflective layer 300, a second metal oxide layer 400, a second reflective layer 310, a third metal oxide player 410, a wiring pattern 500, and a second substrate 600. The first substrate 100, the first metal oxide layer 200, the first reflective layer 300, the second metal oxide layer 400, the wiring pattern 500, and the second substrate 600 may be equal or similar to those described in FIG. 1.

The second reflective layer 310 may be disposed on the second metal oxide layer 400. The second reflective layer 310 may contain the same material described as the example of the first reflective layer 300 in FIGS. 1 and 2, e.g., silver (Ag) or aluminum (Al). The second reflective layer 310 may reflect infrared rays, e.g., the light (λ3) having the third wavelength. Accordingly, the low emissivity film 11 may further increase in thermal insulation function. The second reflective layer 310 may have a thickness of about 10 nm to about 20 nm. The second reflective layer 310 may be satisfactorily attached to the first reflective layer 300 by the second metal oxide layer 400.

The third metal oxide layer 410 may be disposed on the second reflective layer 310. The third metal oxide layer 410 may contain the same material described as the example of the first metal oxide layer 200 in FIGS. 1 and 2. For example, the third metal oxide may contain about 1 at % to about 40 at % of the first metal and about 60 at % to about 99 at % of the oxygen. The third metal may include at least about 90 at % of at least one of aluminum (Al), beryllium (Be), magnesium (Mg), lithium (Li), and a combination thereof. The third metal oxide layer 410 may have a reflective index of about 1.7 or less with respect to the light λ1 having the first wavelength and the light λ2 having the second wavelength. Not only the first and second metal oxide layers 200, 400 but also the third metal oxide layer 410 may function as a mirror of cavity, so that the cavity effect of low emissivity film 11 may increase. For example, the light λ1 having the first wavelength may be reflected by cavity effect of the first metal oxide layer 200, the first reflective layer 300, the second metal oxide layer 400, the second reflective layer 310, and the third metal oxide layer 410. The light λ2 having the second wavelength may pass through the second reflective layer 310 and the third metal oxide layer 410. Accordingly, the color corresponding to the first wavelength may be more clearly expressed on the top surface 600a of the second substrate 600. The second substrate 600 may be satisfactorily attached to the second reflective layer 310 by the third metal oxide layer 410. The third metal oxide layer 410 may buffer physical/mechanical force applied to the second reflective layer 310.

The wiring pattern 500 may be disposed on a top surface of the third metal oxide layer 410. The second substrate 600 may be disposed on the third metal oxide layer 410 and the wiring pattern 500.

Figure 4:
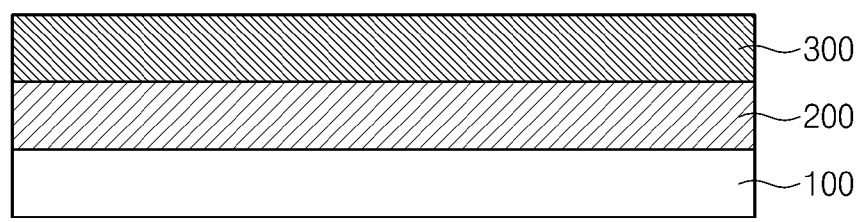
FIGS. 4 and 5 are cross-sectional views illustrating a method for manufacturing the low emissivity film according to embodiments.
Figure 5:
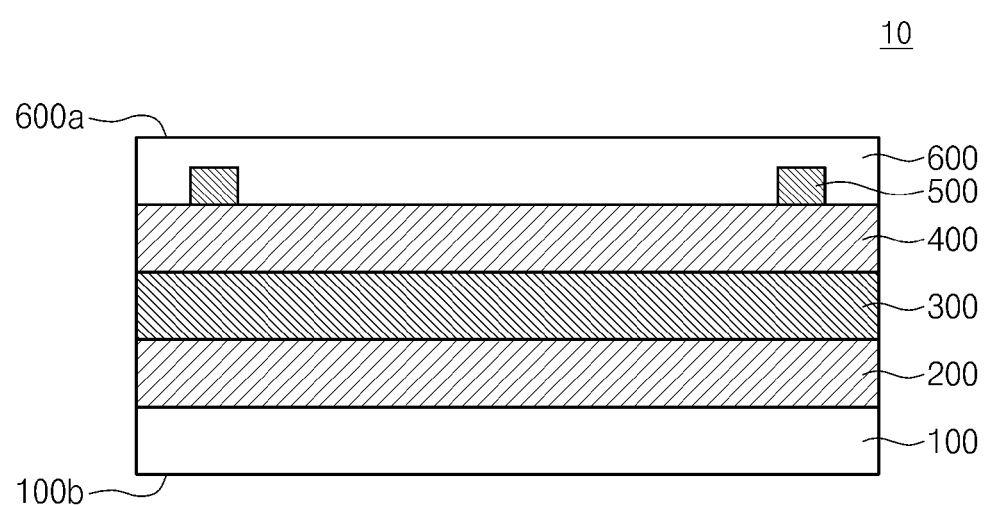

FIGS. 4 and 5 are cross-sectional views illustrating a method for manufacturing the low emissivity film according to embodiments. Hereinafter, descriptions duplicated with those described above will be omitted.

Referring to FIG. 4, the first metal oxide layer 200 and the first reflective layer 300 may be formed on the first substrate 100. For example, the first substrate 100 may be provided in a chamber (not shown). Argon gas and oxygen gas may be supplied into the chamber. The first metal oxide layer 200 may be formed on the first substrate 100 through a sputtering process. One of aluminum (Al), beryllium (Be), magnesium (Mg), lithium (Li), and a combination thereof may be used as a target. The first metal oxide layer 200 may be formed under a condition of a temperature of about 0° C. to about 100° C. to prevent the first substrate 100 from being damaged in the process for forming the first metal oxide layer 200. When the first metal oxide layer 200 has a thickness greater than about 50 nm, it may take a long time to form the first metal oxide layer 200. According to embodiments, the first metal oxide layer 200 may have a thickness of about 20 nm to about 50 nm.

The first reflective layer 300 may be formed on the first metal oxide layer 200. Although the first reflective layer 300 together with the first metal oxide layer 200 may be formed in the same chamber, an embodiment of the inventive concept is not limited thereto. In the process of forming the first reflective layer 300, inert gas (e.g., argon gas) may be supplied into the chamber, and the supply of the oxygen gas may be stopped. The first reflective layer 300 may be formed through the sputtering process using silver (Ag) or aluminum (Al) as a target. The process of forming the first reflective layer 300 may be performed under a condition of a temperature of about 0° C. to about 100° C. to prevent the first substrate 100 from being damaged.

Referring to FIG. 5, the second metal oxide layer 400 and the second substrate 600 may be formed on the first reflective layer 300. The second metal oxide layer 400 may be formed through a method that is equal or similar to that described as the example of the first metal oxide layer 200. The wiring pattern 500 may be formed on the second metal oxide layer 400. The second substrate 600 may be formed on the second metal oxide layer 400 to cover the wiring pattern 500. The process for manufacturing the low emissivity film 10 described in FIGS. 1 and 2 may be completed by the above-described manufacturing example. According to another embodiment, the second reflective layer 310 and the third metal oxide layer 410 may be further formed between the first reflective layer 300 and the second metal oxide layer 400 to manufacture the low emissivity film 11 described in FIG. 3.

Figure 6:
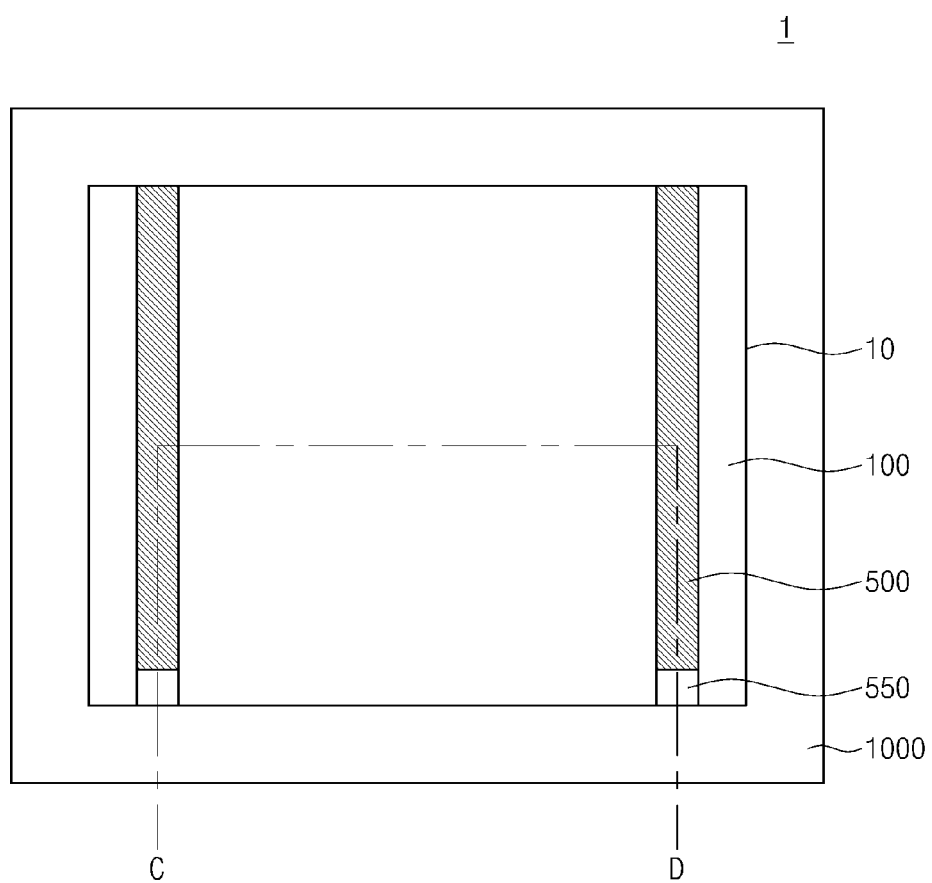
FIG. 6 is a plan view of a window according to embodiments.
Figure 7:
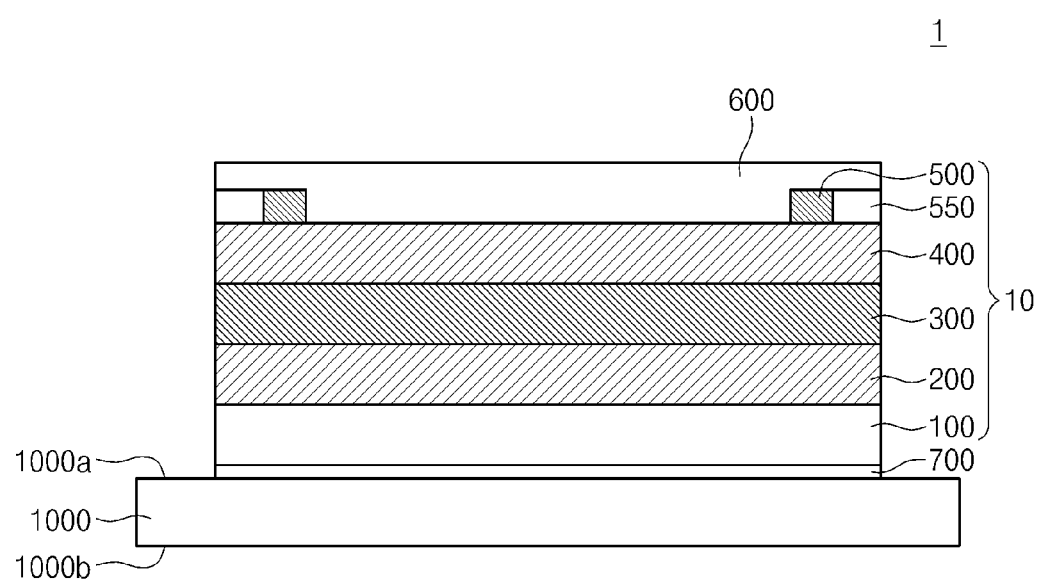
FIG. 7 is a cross-section taken along line C-D of FIG. 6.

FIG. 6 is a plan view of a window according to embodiments. FIG. 7 is a cross-section taken along line C-D of FIG. 6. Hereinafter, descriptions duplicated with those described above will be omitted.

Referring to FIGS. 6 and 7, a window 1 may include a glass layer 1000, a low emissivity film 10, an adhesion layer 700, and a terminal 550. The glass layer 1000 may contain an inorganic substance. The glass layer 1000 may be transparent to enable light to pass therethrough.

The low emissivity film 10 may be disposed on the glass layer 1000. The adhesion layer 700 may be disposed between the low emissivity film 10 and the glass layer 1000. The adhesion layer 700 may be transparent. The adhesion layer 700 may contain a polymer. The low emissivity film 10 may be attached to the glass layer 1000 by the adhesion layer 700. Since the first substrate 100 is flexible, the low emissivity film 10 may be satisfactorily attached to the glass layer 1000. The low emissivity film 10 may be the same as that described in FIG. 1. For example, the low emissivity film 10 may include a first metal oxide layer 200, a first reflective layer 300, a second metal oxide layer 400, a wiring pattern 500, and a second substrate 600, which are stacked on the first substrate 100. For another example, as described in FIG. 3, the second reflective layer 310 and the third metal oxide layer 410 may be further provided between the second metal oxide layer 400 and the second substrate 600. However, an embodiment of the inventive concept is not limited to the number of the metal oxide layers 200, 400, and 410 and the reflective layers 300 and 310. For example, the number of the metal oxide layers 200, 400, and 410 and the reflective layers 300 and 310 may variously vary.

The terminal 550 may be provided at one side of the wiring pattern 500 on the top surface of the second metal oxide layer 400. The terminal 550 may be connected to the wiring pattern 500. The terminal 550 may include a socket, a voltage regulator, or an AC/DC converter. As illustrated in FIG. 6, the terminal 550 may be disposed on an edge of the second metal oxide layer 400 when viewed in a plane. However, an embodiment of the inventive concept is not limited to the arrangement of the terminal 550, and the shape, number, and arrangement of the wiring pattern 500. Referring to FIG. 7, when a voltage is applied to the terminal 550, the voltage may be transmitted to the first reflective layer 300 through the wiring pattern 500 and the second metal oxide layer 400. The first reflective layer 300 may generate heat. As illustrated in FIG. 6, the voltage supplied to the terminal 550 may be uniformly transmitted to the second metal oxide layer 400 through the wiring pattern 500. Accordingly, the heat may be uniformly generated in the first reflective layer 300. Referring again to FIG. 7, one surface 1000a of the glass layer 1000 may have a temperature different from that of the other surface 1000b of the glass layer 1000. Since the internal heat is reflected by the first reflective layer 300, the window 1 may have the thermal insulation function.

The light λ2 having the second wavelength may pass through the first metal oxide layer 200, the first reflective layer 300, and the second metal oxide layer 400. Since light introduced from the outside passes through the glass layer 1000 and the adhesion layer 700, an object disposed on the one surface 1000a of the glass layer 1000 may be viewed through the other surface 1000b of the glass layer 1000. The light λ1 having the first wavelength may be reflected by cavity effect of the first metal oxide layer 200, the first reflective layer 300, and the second metal oxide layer 400 so that the low emissivity film 10 expresses the color corresponding to the first wavelength. Accordingly, the window 1 to which the low emissivity film 10 is attached may have a color. Also, the object disposed on the one surface 1000a of the glass layer 1000 may be less clear when viewed through the other surface 1000b of the glass layer 1000 than an upper side of the one surface 1000a of the glass layer 100.

Hereinafter, manufacturing of the metal oxide layer and the low emissivity film including the same according to experimental examples of the inventive concept and results obtained by evaluating their performance will be described.

Manufacturing of Metal Oxide Layer

Comparative Example 1

Aluminum-titanium oxide was prepared. Here, the aluminum is contained at about 67 at % with respect to the aluminum-titanium. Light having a wavelength of about 550 nm was irradiated to measure a refractive index.

Comparative Example 2

A refractive index was measured through the same method used in Comparative Example 1. However, the aluminum is contained at about 72 at % with respect to the aluminum-titanium.

Comparative Example 3

A refractive index was measured through the same method used in Comparative Example 1. However, the aluminum is contained at about 80 at % with respect to the aluminum-titanium.

Experimental Example 1

A refractive index was measured through the same method used in Comparative Example 1. However, the aluminum is contained at about 90 at % with respect to the aluminum-titanium.

Experimental Example 2

A refractive index was measured through the same method used in Comparative Example 1 by using the aluminum-oxide. However, the aluminum-oxide does not contain titanium, and the aluminum is contained at about 40 at % with respect to the aluminum-oxide.

Experimental Example 3

The first substrate was disposed in a chamber. Argon gas and oxygen gas were supplied into the chamber at a ratio of about 10:1. An inner temperature of the chamber was adjusted to about 25° C. An aluminum target was sputtered at a pressure of about 5 mTorr and DC power of about 150 W to manufacture a first metal oxide layer having a thickness of about 40 nm.

Manufacturing of Low Emissivity Film

Comparative Example 4

The first substrate was disposed in the chamber. Argon gas and oxygen gas were supplied into the chamber at a ratio of about 10:1. The inner temperature of the chamber was adjusted to about 25° C. A zinc target was sputtered at a pressure of 5 mTorr and DC power of about 150 W to manufacture a first zinc oxide layer having a thickness of about 40 nm. The argon gas was supplied into the chamber. Here, the supply of the oxygen was stopped, and the inner temperature of the chamber was maintained at about 25° C. An aluminum target was sputtered at a pressure of about 5 mTorr and DC power of 150 W to manufacture a reflective layer having a thickness of about 13 nm. A second zinc oxide layer having a thickness of about 40 nm was manufactured through the same method as that used for manufacturing the first zinc oxide layer on the reflective layer.

Experimental Example 4

The first metal oxide layer was formed on the second substrate. The first metal oxide layer was formed through the same method as that used in Experimental Example 1. The argon gas was supplied into the chamber. Here, the supply of the oxygen was stopped, and the inner temperature of the chamber is maintained at about 25, like Experimental Example 3. An aluminum target was sputtered at a pressure of 5 mTorr and DC power of about 150 W to manufacture a reflective layer having a thickness of about 13 nm. The second metal oxide layer having a thickness of about 40 nm was manufactured on the reflective layer through the same method as that used in Experimental Example 3.

Figure 8:
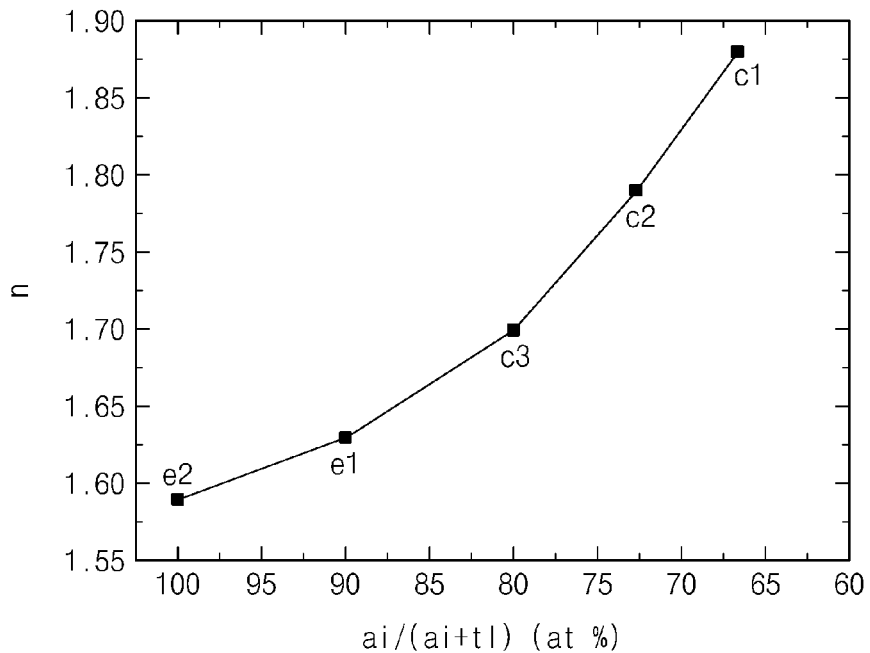
FIG. 8 is a graph showing results obtained by measuring refractive indexes according to Comparative Examples 1 to 3 and Experimental Examples 2 and 3.

FIG. 8 is a graph illustrating results obtained by measuring the refractive indexes in Comparative Examples 1 to 3 and Experimental Examples 1 and 2. X-axis indicates an atomic fraction of aluminum, and y-axis indicates a reflective index at a wavelength of about 550 nm.

Referring to FIG. 8 together with FIG. 2, Experimental Example 1 (e1) and Experimental Example 2 (e2) have refractive indexes of about 1.63 and about 1.58 with respect to light having a wavelength of about 550 nm, respectively. In Comparative Example 1 (c1), Comparative Example 2 (c2), and Comparative Example 3 (c3), the metal oxide layer has a refractive index greater than about 1.7. In Experimental Examples e1 and e2, since the first metal contains at least 90 at % of the aluminum, each of the first metal oxide layer 200 and the second metal oxide layer 400 has a reflective index of about 1.7 or less with respect to the light having the wavelength of about 550 nm.

Figure 9:
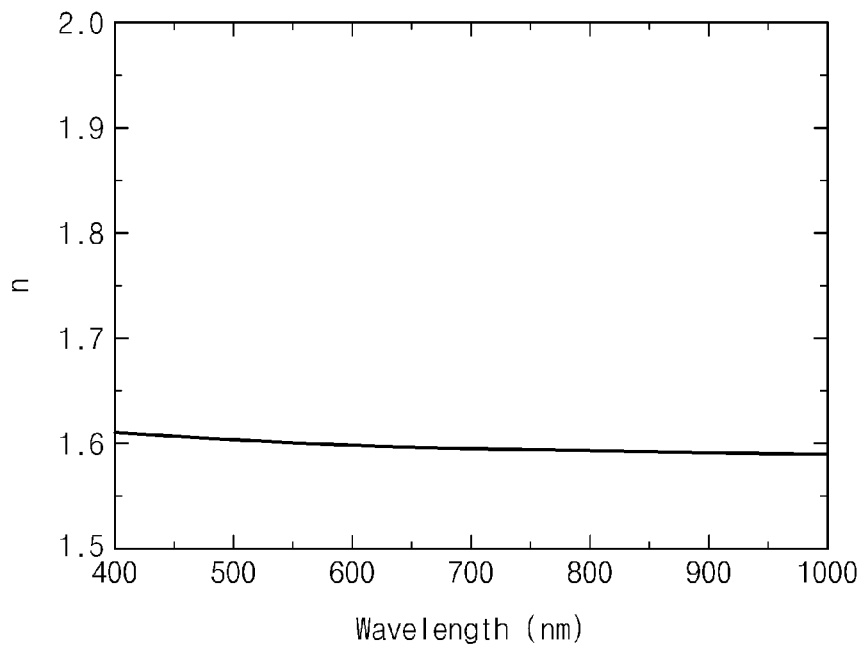
FIG. 9 is a graph illustrating a refractive index according to a wavelength in Experimental Example 3.

FIG. 9 is a graph illustrating a refractive index according to the wavelength in Experimental Example 3.

Referring to FIG. 9 together with FIG. 2, it is seen that the metal oxide layer in Experimental Example 3 has a refractive index of about 1.7 or less with respect to light having a wavelength of about 400 nm to about 1000 nm. Thus, it is sent that each of the first metal oxide layer 200 and the second metal oxide layer 400 has a reflective index of about 1.7 or less with respect to the entire visible light region (e.g., about 400 nm to about 780 nm).

Figure 10:
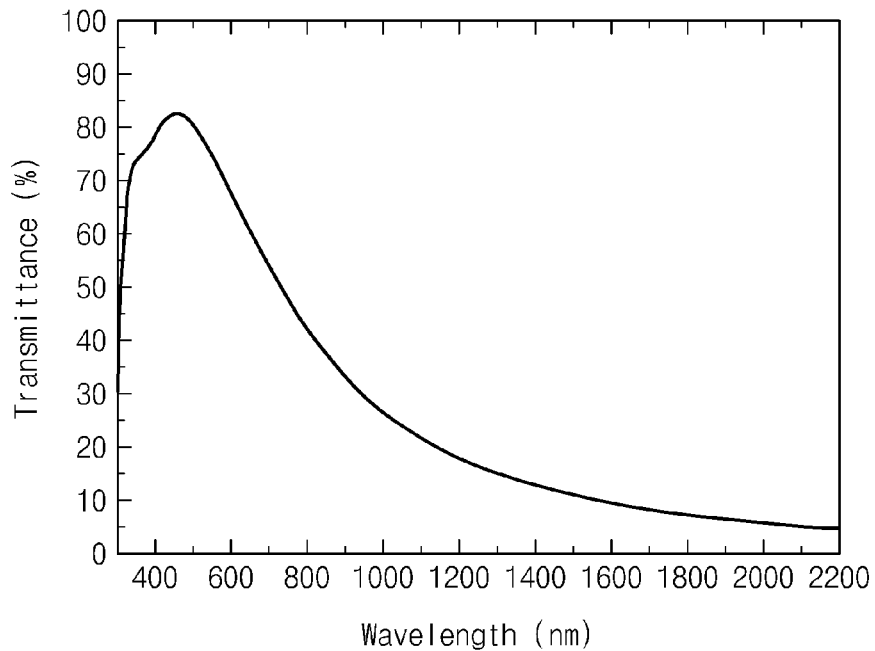
FIG. 10 is a graph illustrating a transmittance according to a wavelength in Experimental Example 4.

FIG. 10 is a graph illustrating a transmittance according to a wavelength of Experimental Example 4.

Referring to FIG. 10 together with FIG. 2, the metal oxide layer in Experimental Example 4 has a low transmittance with respect to light having a wavelength of about 780 nm or more, especially, about 1,600 nm or more. The light having the wavelength of about 780 nm or more may be infrared rays. Since the infrared rays are reflected by the first reflective layer 300, the metal oxide layer in Experimental Example 4 may have a relatively low transmittance with respect to the infrared rays.

Table 1 shows results of the refractive indexes in Experimental Example 4 and Comparative Example 4. The refractive indexes indicate a mean refractive index in a range of about 400 nm to about 700 nm. The refractive indexes were measured under an air condition.

TABLE 1

|  | First and second metal oxide layer materials | Refractive index | Existence of color |
|---|---|---|---|
| Comparative Example 4 | Zinc oxide | 2.0 | X |
| Experimental Example 4 | Aluminum oxide | 1.6 | ○ |

Referring to Table 1 together with FIG. 2, the metal oxide layer in Comparative Example 4 has a refractive index greater than about 1.7, and a color is not expressed. Since the metal oxide layers of Comparative Example 4 does not contain aluminum (Al), beryllium (Be), magnesium (Mg), and lithium (Li), the low emissivity film does not produce the color. Each of the first metal oxide layer 200 and the second metal oxide layer 400 of Experimental Example 4 contains at least about 90 at % of aluminum to have a reflective index of about 1.7 or less with respect to the visible light. Thus, the low emissivity film 10 of Experimental Example 4 may express a color.

Figure 11:
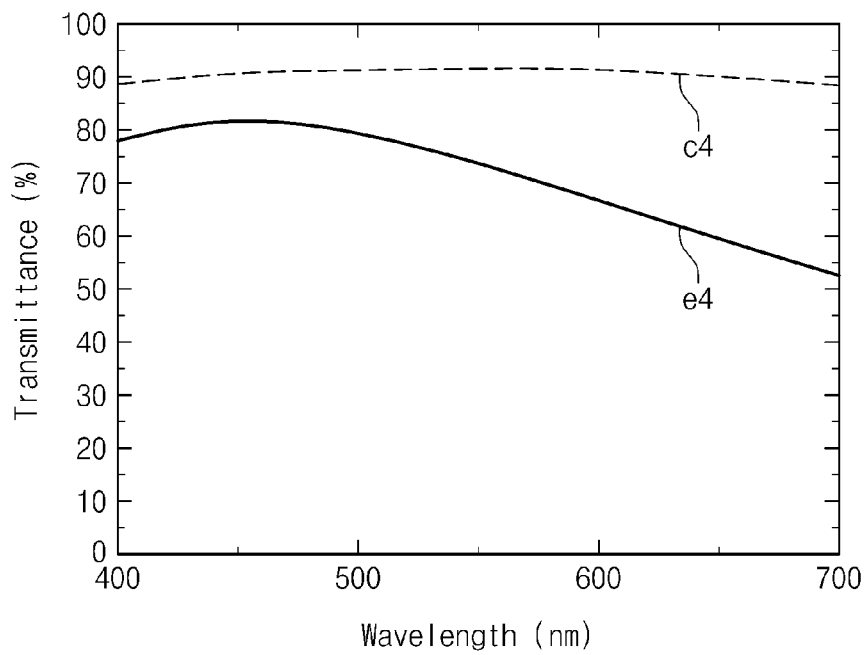
FIG. 11 is a graph illustrating a transmittance according to a wavelength in each of Experimental Example 4 and Comparative Example 4.

FIG. 11 is a graph illustrating a transmittance according to a wavelength in Experimental Example 4 and Comparative Example 4.

Referring to FIG. 11 together with Table 1 and FIG. 2, it is seen that the metal oxide layer in Comparative Example 4 (c4) has a high transmittance with respect to light having a wavelength of about 400 nm to about 700 nm. The metal oxide layer in Experimental Example 4 (e4) has a transmittance less than that in Comparative Example 4 (c4) with respect to the light having the wavelength of about 400 nm to about 700 nm. It is seen that the metal oxide in Experimental Example 4 e4 has a high transmittance with respect to the light having the wavelength of about 450 nm and a low transmittance with respect to the light having the wavelength of about 700 nm. Here, the light having the wavelength of around 450 nm corresponds to the second wavelength, and the light having the wavelength of around 700 nm corresponds to the first wavelength. The first metal of Experimental Example 4 (e4) contains at least about 90 at % of aluminum to enable the visible rays to selectively pass therethrough according to the wavelengths. Thus, the low emissivity film 10 of Experimental Example 4 (e4) may express a color.

According to embodiments, the metal contained in the first metal oxide layer 200 and the second metal oxide layer 400 may be adjusted in kind, content, and/or thickness. The color expressed by the low emissivity film 10 may vary.

According to the embodiment of the inventive concept, the first substrate may be flexible. The first reflective layer may reflect the infrared rays. The low emissivity film may have the thermal insulation function by the first reflective layer. Each of the first metal oxide layer and the second metal oxide layer may have a low reflective index with respect to the light having the first wavelength. The metal contained in the first metal oxide layer and the second metal oxide layer may be adjusted in kind, content, and/or thickness. The light having the first wavelength may be reflected by cavity effect of the first metal oxide layer, the first reflective layer, and the second metal oxide layer. Thus, the low emissivity film may express the color.

The description of the present invention is intended to be illustrative, and those with ordinary skill in the technical field of the present invention will be understood that the present invention can be carried out in other specific forms without changing the technical idea or essential features. Thus, the above-disclosed embodiments are to be considered illustrative and not restrictive.

What is claimed is:

1. A low emissivity film comprising:
   a first substrate;
   a first metal oxide layer disposed on the first substrate, the first metal oxide layer comprising a first metal, wherein the first metal contains at least about 90 atomic percent (at %) of one of aluminum (Al), beryllium (Be), magnesium (Mg), and lithium (Li);
   a first reflective layer disposed on the first metal oxide layer to reflect infrared rays;
   a second metal oxide layer disposed on the first reflective layer, the second metal oxide layer comprising a second metal, wherein the second metal contains at least about 90 at % of one of aluminum (Al), beryllium (Be), magnesium (Mg), and lithium (Li); and
   a second substrate disposed on the second metal oxide layer,
   wherein each of the first metal oxide layer and the second metal oxide layer has a reflective index of about 1.7 or less with respect to light having a first wavelength and light having a second wavelength,
   the first wavelength is one selected from about 380 nm to about 780 nm, and
   the second wavelength is one selected from about 380 nm to about 780 nm, which is different from the first wavelength.

2. The low emissivity film of claim 1, wherein the first reflective layer contains silver (Ag) or aluminum (Al).

3. The low emissivity film of claim 1, wherein the first metal oxide layer has a thickness of about 20 nm to about 50 nm,
   the first reflective layer has a thickness of about 10 nm to about 20 nm, and
   the first metal oxide layer has a thickness of about 20 nm to about 50 nm.

4. A window comprising:
   a glass layer;
   an adhesion film disposed on the glass layer;
   a first substrate disposed on the adhesion film;
   a first metal oxide layer disposed on the first substrate, the first metal oxide layer comprising a first metal, wherein the first metal contains at least about 90 atomic percent (at %) of one of aluminum (Al), beryllium (Be), magnesium (Mg), and lithium (Li);
   a first reflective layer disposed on the first metal oxide layer to reflect infrared rays;
   a second metal oxide layer disposed on the first reflective layer, the second metal oxide layer comprising a second metal, wherein the second metal contains at least about 90 at % of one of aluminum (Al), beryllium (Be), magnesium (Mg), and lithium (Li); and
   a second substrate disposed on the second metal oxide layer,
   wherein each of the first metal oxide layer and the second metal oxide layer has a reflective index of about 1.7 or less with respect to light having a first wavelength and light having a second wavelength,
   the first wavelength is one selected from about 380 nm to about 780 nm, and the second wavelength is one selected from about 380 nm to about 780 nm, which is different from the first wavelength.

5. The window of claim 4, further comprising:

a wiring pattern disposed on the second metal oxide layer; and a terminal connected to the wiring pattern on the second metal oxide layer.

6. The window of claim 4, further comprising:

a second reflective layer disposed on the second metal oxide layer to reflect the infrared rays; and a third metal oxide layer disposed on the first reflective layer, the third metal oxide layer comprising a third metal, wherein the third metal contains at least about 90 at % of one of aluminum (Al), beryllium (Be), magnesium (Mg), and lithium (Li).

* * * * *